(12) United States Patent
Yasuda et al.

(10) Patent No.: US 7,653,855 B2
(45) Date of Patent: Jan. 26, 2010

(54) RANDOM NUMBER TEST CIRCUIT, RANDOM NUMBER GENERATION CIRCUIT, SEMICONDUCTOR INTEGRATED CIRCUIT, IC CARD AND INFORMATION TERMINAL DEVICE

(75) Inventors: Shinichi Yasuda, Yokohama (JP); Shinobu Fujita, Kawasaki (JP); Koichi Fujisaki, Yokohama (JP); Tetsufumi Tanamoto, Yokohama (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/875,360

(22) Filed: Oct. 19, 2007

(65) Prior Publication Data

US 2008/0046790 A1 Feb. 21, 2008

Related U.S. Application Data

(63) Continuation of application No. 11/067,672, filed on Mar. 1, 2005, now abandoned.

(30) Foreign Application Priority Data

Mar. 2, 2004 (JP) ............................. 2004-058199

(51) Int. Cl.
*G01R 31/28* (2006.01)
*G06F 11/00* (2006.01)
(52) U.S. Cl. ...................................... 714/739; 714/728
(58) Field of Classification Search ....................... None
See application file for complete search history.

(56) References Cited

U.S. PATENT DOCUMENTS

| 4,513,386 | A | * | 4/1985 | Glazer ........................ 708/255 |
| 5,018,140 | A | * | 5/1991 | Lee et al. ..................... 370/514 |
| 5,099,480 | A | * | 3/1992 | Murata ........................ 714/715 |
| 5,163,070 | A | * | 11/1992 | Bielby et al. ................ 375/367 |
| 5,258,936 | A | * | 11/1993 | Gallup et al. ............... 708/254 |
| 6,346,822 | B2 | * | 2/2002 | Nishikawa ................... 326/16 |
| 6,502,116 | B1 | * | 12/2002 | Kelly et al. ................. 708/250 |
| 2002/0194557 | A1 | * | 12/2002 | Park ........................... 714/718 |
| 2004/0103131 | A1 | * | 5/2004 | Henry et al. ................ 708/250 |
| 2004/0123199 | A1 | * | 6/2004 | Tan ............................. 714/728 |
| 2005/0041803 | A1 | * | 2/2005 | Chateau et al. .............. 380/46 |

(Continued)

FOREIGN PATENT DOCUMENTS

JP 2003-196081 7/2003

OTHER PUBLICATIONS

A. Ruhkin, et al., "Cumulative Sums (Cusum) Test", NIST Special Publication 800-22, Chap. 2, Sec. 14, 2001, pp. 52-54.

(Continued)

*Primary Examiner*—Kevin L Ellis
*Assistant Examiner*—Guerrier Merant
(74) *Attorney, Agent, or Firm*—Oblon, Spivak, McClelland, Maier & Neustadt, L.L.P.

(57) ABSTRACT

A random number test circuit includes a counting unit to count number of repetitions of a certain-value bit in a random number sequence, the repetitions occurring in series, a detecting unit to detect a plurality of numbers corresponding to a kind of bits in the random number sequence, and a determining unit to determine whether the random number sequence is normal, based on the numbers.

17 Claims, 10 Drawing Sheets

U.S. PATENT DOCUMENTS

2005/0071399 A1* 3/2005 Bonaccio et al. ............ 708/250
2005/0193045 A1* 9/2005 Yamamoto et al. .......... 708/250
2006/0008083 A1* 1/2006 Saito .......................... 380/28
2006/0040731 A1* 2/2006 Yamamoto et al. ............ 463/22

OTHER PUBLICATIONS

R.C. Fairfield, et al., "An LSI Random Number Generator (RNG)", Proc. CRYPTO '84, pp. 203-230 (1984).

* cited by examiner

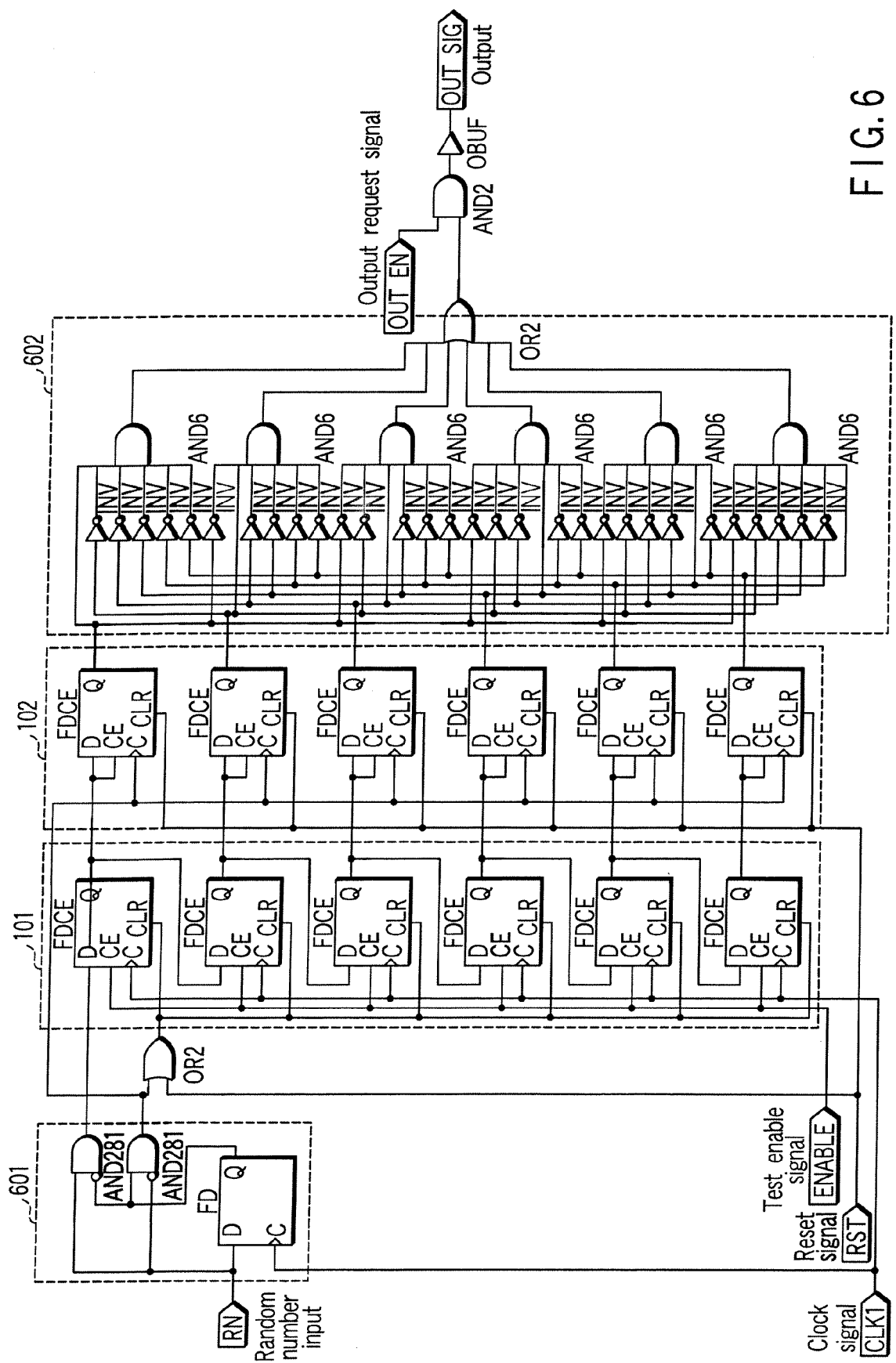
F I G. 6

RANDOM NUMBER TEST CIRCUIT, RANDOM NUMBER GENERATION CIRCUIT, SEMICONDUCTOR INTEGRATED CIRCUIT, IC CARD AND INFORMATION TERMINAL DEVICE

CROSS-REFERENCE TO RELATED APPLICATIONS

This application is based upon and claims the benefit of priority from U.S. application Ser. No. 11/067,672, filed Mar. 1, 2005, and from prior Japanese Patent Application No. 2004-058199, filed Mar. 2, 2004. The entire contents of the above applications are incorporated herein by reference.

BACKGROUND OF THE INVENTION

1. Field of the Invention

The present invention relates to a random number test circuit capable of testing random number outputs simply and accurately, random number generation circuit, semiconductor integrated circuit, IC card and information terminal device.

2. Description of the Related Art

Random numbers are used in various fields, such as scientific computation fields, games, encryption fields, etc. In particular, in these years, there is an increasing demand for random number generation circuits in accordance with an increase in the importance of information security techniques. In the prior art, to realize a random number generation circuit by a small-scale circuit, pseudo-random number generation circuits utilizing a certain formula have been used. Such pseudo-random number generation circuits, however, generate random numbers based on certain computation, therefore their random number outputs are deterministic and hence have periodicity or regularity. In light of this, those random number circuits have come to be proposed, which utilize a physical phenomenon or noise and therefore can output high quality random numbers that have no periodicity or regularity, and which have a relatively small circuit scale.

When such a random number generation circuit as above is mounted on a chip, a test method different from conventional ones must be used.

In general, in a random number generation circuit, clock timing is adjusted and/or a sequential circuit is used, therefore holding of values using registers and computation are alternately performed. If computation is normal logical one that uses, for example, a conventional pseudo-random number circuit, a single output is uniquely determined from a single input. Accordingly, if the value of a register as an input is determined, the value of another register as an output is determined. Thus, the computation section can be checked for correctness by comparing all register values. However, if the computation section contains a certain analog component as in a random number generation circuit, i.e., if the computation section is devised not to produce definite values, it cannot be determined from register values whether the computation section is correctly operating.

Therefore, to test random number generation circuits of this type, it is necessary to acquire output data and subject it to a random number test, such as a statistical test (see, for example, Jpn. Pat. Appln. KOKAI Publication No. 2003-196081).

However, to perform a statistical test of a random number output, it is necessary to assign limited output pins to random number outputs in order to acquire the data concerning the random number generation circuit itself, and it is also necessary to perform processing different from that performed in other circuits. As a result, the circuit scale is inevitably increased.

To utilize random numbers of high quality in, for example, mobile phones, the random number test must be as simple as possible.

As a conventional simple test method, Cumulative Sums Test (Cu-Sum Test) is known, which is described in NIST SP 800-22 issued by the National Institute of Standards and Technology as an organ of the Department of Commerce of U.S. In this test, if the output is "1", a value of +1 is assigned, while if the output is "0", a value of −1 is assigned. Further, if the sum of the values exceeds a threshold value, it is determined to be abnormal. This method is effective if the output values of "1" and "0" are out of balance. However, where the same value is repeated in a certain cycle, e.g., "000111000111 . . . ", the method is ineffective.

To avoid this, another test for testing repetition of a value is needed. For instance, manual testing may be performed, e.g., autocorrelation function be utilized, a Fourier transform be performed, or the number of repetitions of "1" or "0" be recorded and checked. However, manual testing, e.g., use of autocorrelation function or a Fourier transform, does not lead to reduction of effort and labor. Further, use of autocorrelation function or a Fourier transform, or record of repetitions does not define the number of random number bits that should be subjected to such tests. Actually, random numbers are generated more often in units of certain bits, such as 64 bits or 128 bits, than continuously. The above-mentioned method of using autocorrelation function, a Fourier transform or record of repetitions cannot deal with such random number sequences for various purposes.

Furthermore, if the test circuit is so small as not to obstruct the random number generation circuit, it may be contained in the random number generation circuit to output only a test signal and thereby reduce the number of pins. Actually, however, if the test circuit for performing the Cu-Sum Test and the other tests are contained, the resultant circuit scale is inevitably too large.

As described above, it is difficult for the prior art to test the periodicity of random number outputs in a simple way.

BRIEF SUMMARY OF THE INVENTION

According to a first aspect of the invention, there is provided a random number test circuit comprising: a counting unit configured to count number of repetitions of a certain-value bit in a random number sequence, the repetitions occurring in series; a detecting unit configured to detect a plurality of numbers corresponding to a kind of bits in the random number sequence; and a determining unit configured to determine whether the random number sequence is normal, based on the numbers.

According to a second aspect of the invention, there is provided a random number generation circuit comprising: a generation unit configured to generate the random number sequence; and the random number test circuit according to first aspect, which tests the random number sequence.

According to a third aspect of the invention, there is provided a random number test circuit comprising: a receiving unit configured to receive a random number sequence; a detection circuit configured to detect a plurality of bit data items of "1" or "0" in the random number sequence; a shift register which holds in series the bit data items of "1" or "0" repeated in the random number sequence, based on the detected bit data items; a register which holds, based on the detected bit data items, a content of the shift register when each of the bit data items is switched from "1" to "0" or from "0" to "1"; and a determination circuit configured to determine types of repetitions of the bit data items of "1" or "0" from the held content.

According to a fourth aspect of the invention, there is provided a random number generation circuit comprising: a generation unit configured to generate the random number sequence; and the random number test circuit according to third aspect, which tests the random number sequence.

According to a fifth aspect of the invention, there is provided a random number test circuit comprising: a receiving unit configured to receive a random number sequence; a detection circuit configured to detect a plurality of bit data items of "1" and "0" in the random number sequence; a plurality of shift registers which hold in series the bit data items of "1" and "0" repeated in the random number sequence, based on the detected bit data items; a register which holds, based on the detected bit data items, a plurality of contents of the shift registers when the bit data items are switched from "1" and "0" to "0" and "1", respectively; and a determination circuit configured to determine types of repetitions of the bit data items "1" and "0" from the held contents.

According to a sixth aspect of the invention, there is provided a random number generation circuit comprising: a generation unit configured to generate the random number sequence; and the random number test circuit according to fifth aspect, which tests the random number sequence.

According to a seventh aspect of the invention, there is provided a semiconductor integrated circuit device comprising: a generation unit configured to generate a random number sequence; a random number test circuit which tests the random number sequence supplied from the generation unit, and generates a test signal; and an output terminal which outputs the test signal; wherein the random number test circuit includes: a receiving unit configured to receive the random number sequence; a detection circuit configured to detect a plurality of bit data items of "1" and "0" in the random number sequence; a plurality of shift registers which hold in series the bit data items of "1" and "0" repeated in the random number sequence, based on the detected bit data items; a register which holds, based on the detected bit data items, a plurality of contents of the shift registers when the bit data items are switched from "1" and "0" to "0" and "1", respectively; and a determination circuit configured to determine types of repetitions of the bit data items "1" and "0" from the held contents According to a eighth aspect of the invention, there is provided a integrated circuit card provided with a semiconductor integrated circuit, the semiconductor integrated circuit comprising: a generation unit configured to generate a random number sequence; a random number test circuit which tests the random number sequence supplied from the generation unit, and generates a test signal; and an output terminal which outputs the test signal; wherein the random number test circuit includes: a receiving unit configured to receive the random number sequence; a detection circuit configured to detect a plurality of bit data items of "1" and "0" in the random number sequence; a plurality of shift registers which hold in series the bit data items of "1" and "0" repeated in the random number sequence, based on the detected bit data items; a register which holds, based on the detected bit data items, a plurality of contents of the shift registers when the bit data items are switched from "1" and "0" to "0" and "1", respectively; and a determination circuit configured to determine types of repetitions of the bit data items "1" and "0" from the held contents.

According to a ninth aspect of the invention, there is provided an information terminal device provided with a semiconductor integrated circuit, the semiconductor integrated circuit comprising: a generation unit configured to generate a random number sequence; a random number test circuit which tests the random number sequence supplied from the generation unit, and generates a test signal; and an output terminal which outputs the test signal; wherein the random number test circuit includes: a receiving unit configured to receive the random number sequence; a detection circuit configured to detect a plurality of bit data items of "1" and "0" in the random number sequence; a plurality of shift registers which hold in series the bit data items of "1" and "0" repeated in the random number sequence, based on the detected bit data items; a register which holds, based on the detected bit data items, a plurality of contents of the shift registers when the bit data items are switched from "1" and "0" to "0" and "1", respectively; and a determination circuit configured to determine types of repetitions of the bit data items "1" and "0" from the held contents.

BRIEF DESCRIPTION OF THE SEVERAL VIEWS OF THE DRAWING

FIG. 6 is a view illustrating a specific structural example of the second embodiment of the invention;

DETAILED DESCRIPTION OF THE INVENTION

Embodiments of the invention will be described in detail with reference to the accompanying drawings.

In the embodiments, attention is paid to the types of repetition of "1" and/or "0" in a random number output. "A type of repetition" used in the specification means the number of repetitions of the same bit data ("1" or "0"). For example, in the case of an output of 001101001001011001111010, this output is considered to contain three types of repetition of "1", i.e., one repetition (1), two repetitions (11) and four repetitions (1111). Similarly in the case of an output of 1100 110011001100110011001100, this output is considered to contain only one type of repetition of "1", i.e., two repetitions. If the output contains only one type of repetition of "1" and only one type of repetition of "0", it is considered that the output has periodicity.

Firstly, a description will be given of the fundamental operation of the embodiments, using a case where the number of repetitions of "1" is counted from a 24-bit random number sequence of 001101001001011001111010.

Figure 1:
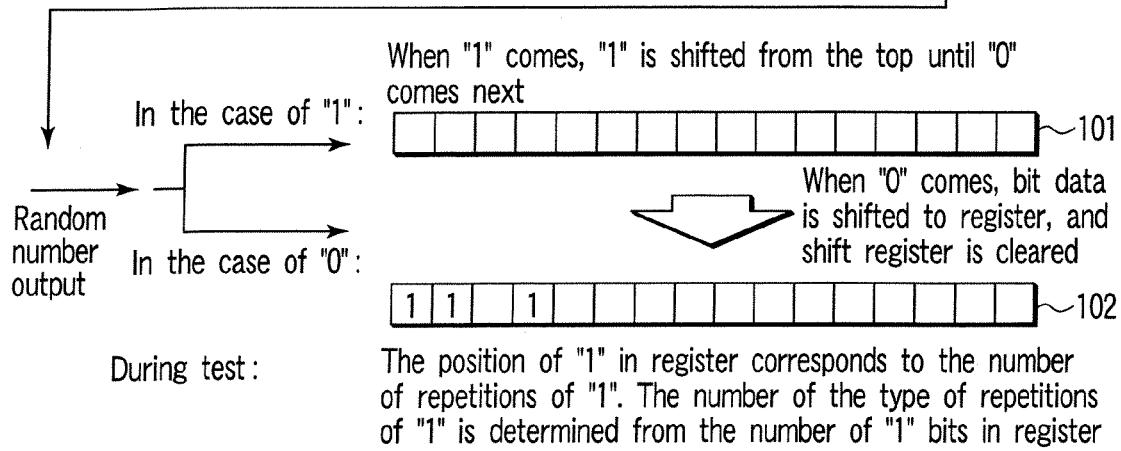
FIG. 1 is a schematic view illustrating a fundamental structure of the embodiments.

FIG. 1 is a schematic view useful in explaining processing performed by a random number test circuit according to the embodiments.

As shown, the random number test circuit according to the embodiments comprises a shift register 101 and a register 102 for latching the value of register 101 when "0" is output as a random number. The initial values of the registers can be set to "0".

A random number sequence of 001101001001011001 1111010 is input in order beginning with the lowest order bit. Since the first bit is "0", the value of the shift register 101 is shifted to the register 102. At this time, however, since the shift register 101 is set to the initial value of "0", the value of the register 102 is kept at "0".

The next bit is "1". Therefore, "1" is input as the leading bit of the shift register 101.

The next (or third) bit is "0". Therefore, the value "1" of the shift register 101 is shifted to the register 102, and the shift register 101 is cleared. The leading bit of the register 102 is set to "1".

The next bit is "1". Therefore, the leading bit of the shift register 101 is set to "1".

While the random number output is "1", "1" is sequentially stored in the shift register 101.

When the random number output becomes "0", "1" in the shift register 101 is shifted to the register 102. At this time, "1" stored so far in the register 102 is kept as it is, and newest "1" is stored in the register 102 at the position corresponding to the leading position of newest "1" in the shift register 101. Simultaneously, the shift register 101 is cleared. That is, at this stage, "1" is stored in the register 102 at the first and fourth bit positions.

Subsequently, shifting and latching of "1" is repeated, depending upon whether the random number output is "1" or "0". When "1" is shifted from the shift register 101 to the register 102, if "1" already exists in the register 102 at the same position as that of the shift register 101, already existing "1" is kept unchanged at that position.

After the output of the random number sequence is finished, the position of each "1" bit in the register 102 corresponds to the type of repetition of "1". In the above case, since "1" is stored in the register 102 at the first, second and fourth positions, the number of types of "1" repetition is three. Each of the types is a type of the repetition of bit data.

Since the shift register 101 and register 102 are used as described above, the number of the types can be determined. If only one type of repetition exists, this is unnatural as random numbers, and hence the random number sequence is determined to be abnormal. Also when there are only two types of repetition, the random number sequence may be determined abnormal. Depending upon the purpose, the threshold value may be set strictly. The sizes of the shift register 101 and register 102 depend upon the bit length of the output random number sequence. There is no problem if the sizes of the registers are identical to the size of the random number sequence. However, the sizes are not limited to it.

Figure 2:
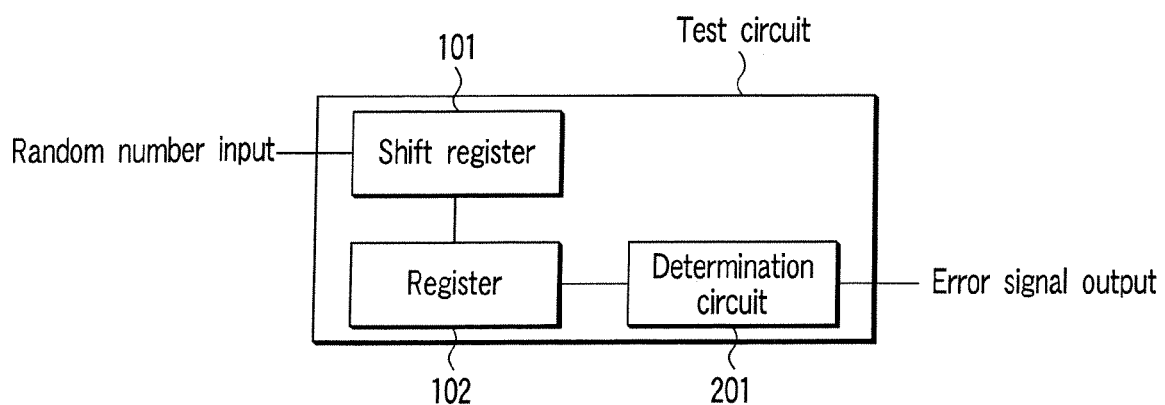
FIG. 2 is a block diagram illustrating the configuration of a test circuit employed in the embodiments.

FIG. 2 is a block diagram illustrating the configuration of a random number test circuit employed in the embodiments.

A random number sequence output from a random number generation circuit (not shown) is input to the shift register 101. The shift register 101 performs predetermined operations corresponding to "0" and "1", and shifts values to the register 102. After a certain period elapses, or after a random number sequence of a desired bit length is output, a determination circuit 201 reads the values of the register 102, and outputs an error signal if the random number sequence is abnormal.

The above-described fundamental structure of the embodiments will be described in more detail.

Figure 3:
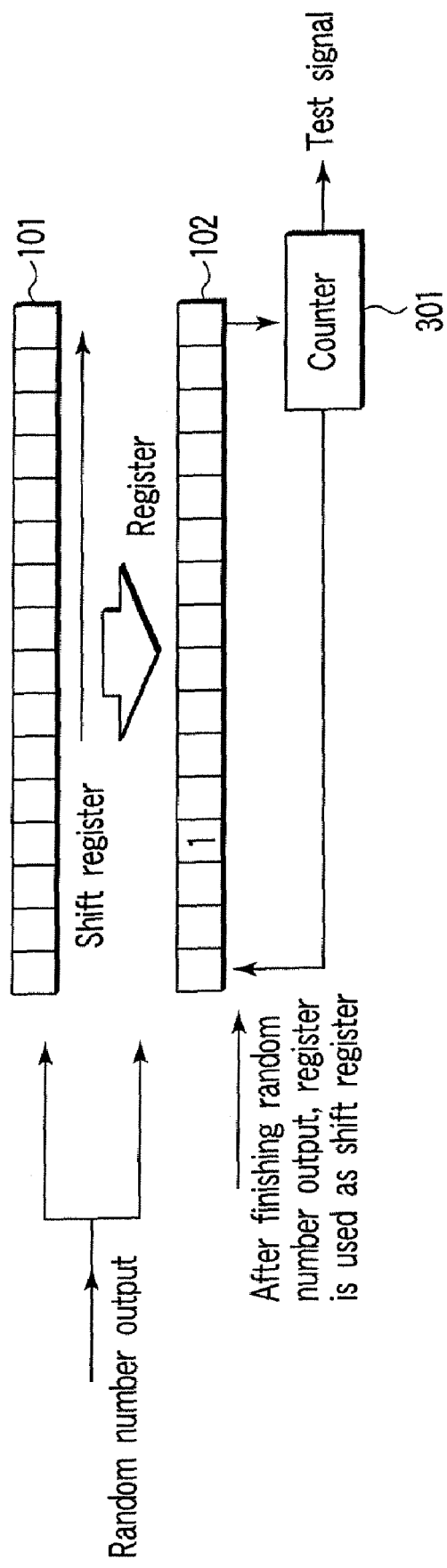
FIG. 3 is a view illustrating the structure of a first embodiment of the present invention.

FIG. 3 is a schematic view illustrating a first embodiment of the invention. In the first embodiment, a counter 301 is used as the determination circuit for determining the type of repetition of bit data.

After the output of the random number sequence is finished, the values of the register 102 are sequentially shifted to the counter 301, and a test signal corresponding to the value of the counter 301 is output. The values of the register 102 can be easily shifted by providing, for example, a selector at the input of each register. Alternatively, the same shift register may be reused, or another shift register may be prepared, to which the values of the shift register are shifted after finishing the output of a random number sequence.

Figure 4:
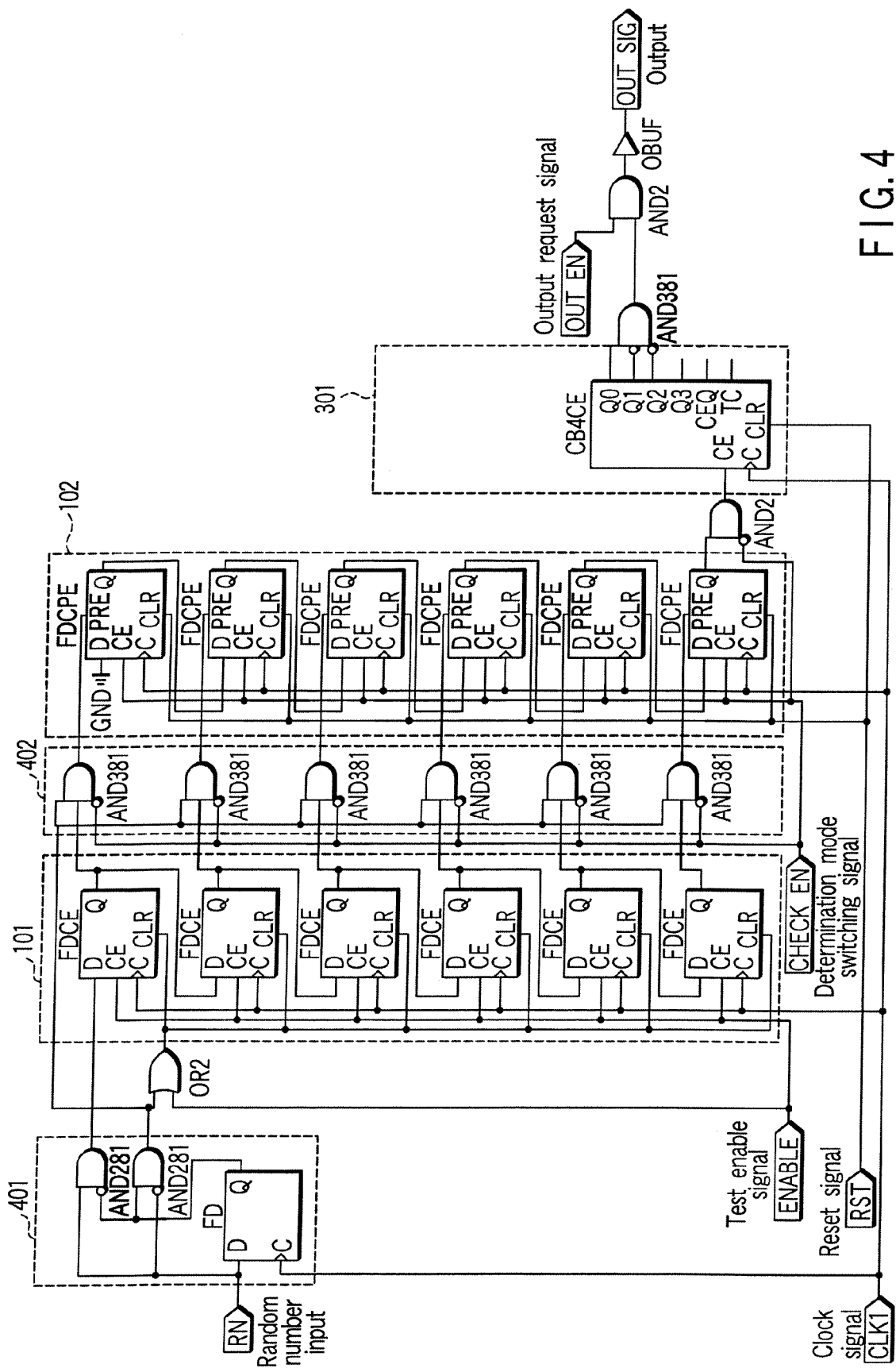
FIG. 4 is a view illustrating a specific structural example of the first embodiment of the invention.

FIG. 4 is a view illustrating a specific structural example of the first embodiment of the invention.

As shown, this example comprises a 1/0 detection circuit 401, shift register 101, transfer circuit 402, register 102 and counter 301. In this example, the circuit structure is configured to count the number of repetitions of "1".

A reset signal is used to clear the values of flip-flops employed in the circuit, and the counter 301. This is because it is necessary to clear the previous histories of the circuits before starting to test random numbers. The 1/0 detection circuit 401 detects the leading edge and trailing edge of a random number sequence signal, i.e., the start of "1" and that of "0".

In the example, the shift register 101 has six stages, but the number of stages is not limited to six. When a test enable signal supplied to the CE (clock enable) terminal of each flip-flop included in the shift register 101 is ON, the shift register 101 functions and the testing circuit functions.

When the random number sequence shifts from "0" to "1", the 1/0 detection circuit 401 generates a rise signal to the shift register 101, thereby writing "1" in the leading flip-flop of the shift register. Subsequently, until the random number sequence shifts from "1" to "0", and the 1/0 detection circuit 401 generates a fall signal, the written "1" is shifted to the next flip-flop of the shift register 101 in accordance with a clock signal. When the fall signal is detected, the shift register 101 shifts the value to the register 102 via the transfer circuit 402. At this time, the shift register 101 is cleared, and waits for the next rise signal.

The transfer circuit 402 is provided to overwrite the value of the register 102 with that of the shift register 101, and is formed of an AND circuit for inputting a rise signal from the 1/0 detection circuit 401, the output of the shift register 101 and the inverted signal of a determination mode switching signal. When the determination mode switching signal is OFF, if a rise signal is detected, the shift register is cleared. However, since there is a delay between the time of detection of the fall signal and that of clearing of the shift register 101, the transfer circuit 402, connected to the flip-flop that holds "1", outputs "1" during the delay time. The inverted signal of a determination mode switching signal is also supplied to the CE (clock enable) terminal of the register 102. The value of the register 102 at this time is determined from the levels of its asynchronous set terminal and asynchronous clear terminal.

The register 102 fetches the values of the shift register 101 when the 1/0 detection circuit 401 detects a fall signal. When the determination mode switching signal is ON, the register 102 is separated in function from the shift register 101, and functions as a shift register, thereby sequentially shifting the stored values to the counter 301. The counter 301 counts the number of "1" in the register 102 by incrementing its count value by one when the value of the register 102 is "1". In this specific example, since six shift registers are used, the number of the types of repetition detectable is 6 at maximum, i.e., "110" in the binary system. Therefore, an AND circuit having three inputs and an inverter are connected to the counter 301. With this structure, it is determined whether the count value is erroneous.

When the count value is "001", the combination of the AND circuit and inverter outputs "1". The count value "001" indicates that the register 102 holds only one "1", i.e., the random number sequence contains only one type of repetition of "1". When the last output request signal is ON, the final error signal is output.

This is just an example of the random number test circuit, and a number of modifications having a similar function can exist. For example, the flip-flops employed are not limited to the D type. Further, the counter is not necessarily a binary one. The fall signal is not always generated by the 1/0 detection circuit 401, but may be formed of the inverted signal of a random number input. The configuration shown in FIG. 6 can be adapted to this example. If the scale of the shift register is changed, the scale of the counter circuit and the number of the inputs of the AND circuit for error (abnormality) detection, etc., must be changed according to the scale of the shift register. If the last flip-flop of the shift register outputs an error signal, it may be removed from the shift register.

Figure 5:
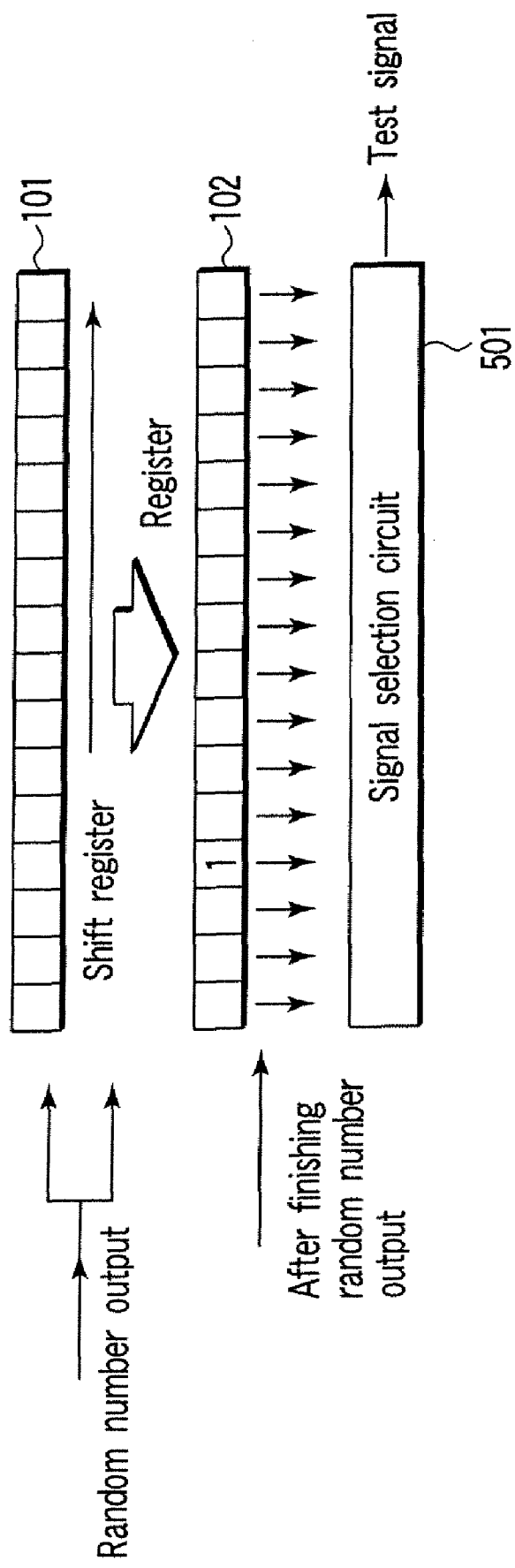
FIG. 5 is a view illustrating the structure of a second embodiment of the present invention.

FIG. 5 shows a second embodiment of the invention.

In the second embodiment, a signal selection circuit 501 is used as the determination circuit to determine each type of repetition of bit data.

In this embodiment, after the output of a random number sequence is finished, each value of the register 102 is used as a selection signal. If the signal selection circuit 501 receives only one selection signal, it can output an error signal as a test signal.

FIG. 6 shows a specific example of the second embodiment.

The random number test circuit employed in this example comprises a 1/0 detection circuit 601, shift register 101, register 102 and signal selection circuit 602. Since the functions and structures of the 1/0 detection circuit 601 and shift register 101 are the same as those of the corresponding elements in FIG. 4, no description is given thereof. The register 102 is a modification of the register in FIG. 4. Specifically, the output of each flip-flop of the shift register 101 is connected to the input and CE terminal (clock enable terminal) of the corresponding flip-flop of the register 102. The fall signal of the 1/0 detection circuit 601 is supplied as a clock to the register 102. Only flip-flops of the register 102 connected to the flip-flops of the shift register 101 that hold "1" operate, and write "1" therein in synchronism with the fall signal.

In the signal selection circuit 602, six combinations of each of the six AND circuits and inverter are arranged. Each of the six AND circuits outputs "1" only when the value of the corresponding one of the first to sixth flip-flops is "1". After a random number sequence is acquired, if only one of the AND circuits outputs "1", this indicates that the flip-flops of the register hold only one "1", i.e., the random number sequence contains only one type of repetition of "1". When the last output request signal is ON, the final error signal is output.

The structure shown in FIG. 6 is also just an example. For example, the register 102 can be replaced with that shown in FIG. 4. Further, the same processing can be performed if a comparison circuit is used instead of the signal selection circuit.

In the case of FIG. 4 where a counter is used as the determination circuit, the number of required circuits can be reduced. However, in this case, the registers 102 are used as shift registers to sequentially send their values to the counter, therefore relatively much time is required before determination. To operate the whole circuit at high speed, the circuit structure of FIG. 6 is more preferable, in which the values of the flip-flops of the register 102 are directly detected. Further, if the number of the stages (i.e., flip-flops) of the shift register is small, the structure of FIG. 6 can have a smaller circuit scale than the case of using a counter.

Figure 7:
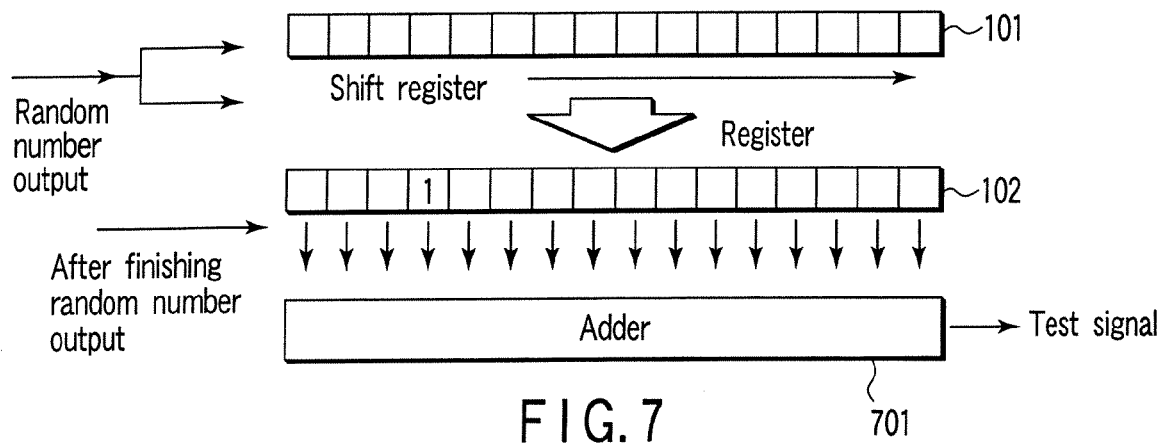
FIG. 7 is a view illustrating the structure of a third embodiment of the present invention.

FIG. 7 shows a third embodiment of the invention.

As shown, the third embodiment uses an adder 701 as the determination circuit to determine the type of repetition of bit data. After the output of a random number sequence is finished, the adder 701 sums the values of the register 102, and outputs a detection signal indicating the sum. This structure can also deal with the case where the number of the types of repetition of bit data, which is used as a threshold value for determining an abnormality or error, is set to two or more.

In the above-described first to third embodiments, only the repetitions of "1" are detected. However, the repetitions of "0" can be detected in the same manner.

Figure 8:
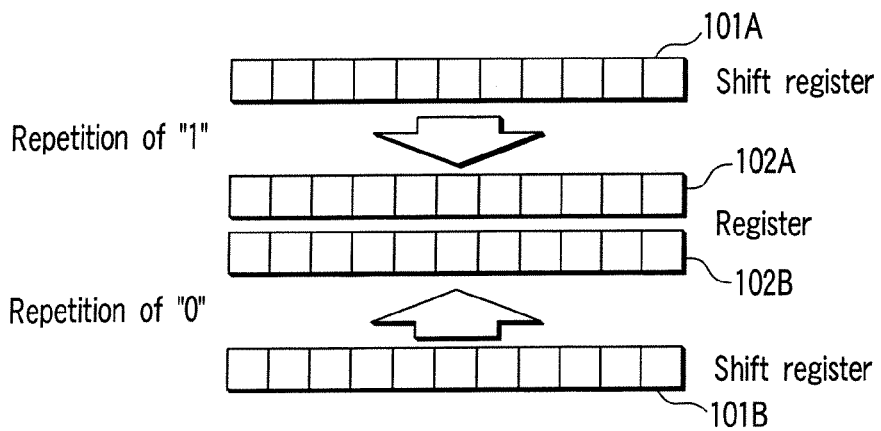
FIG. 8 is a view illustrating the structure of a fourth embodiment of the present invention.

FIG. 8 shows a fourth embodiment of the invention. In this embodiment, the repetitions of "1" and those of "0" are both detected, and comprises a shift register 101A and register 102A that are used to detect the repetitions of "1", and a shift register 101B and register 102B that are used to detect the repetitions of "0".

It is sufficient if only the repetitions of "1" are detected. However, a more accurate test can be realized if both the repetitions of "1" and "0" are detected as in FIG. 8. An abnormal output, e.g., 110001100011000 . . . , can be detected.

Figure 9:
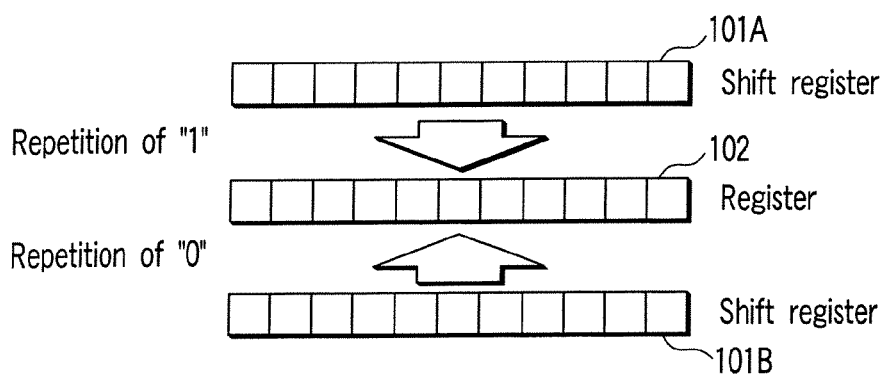
FIG. 9 is a view illustrating the structure of a fifth embodiment of the present invention.

FIG. 9 shows a fifth embodiment of the invention. The structure of FIG. 9 is simpler than that of FIG. 8. That is, the fifth embodiment employs only a single register 102 commonly used for both "1" and "0". This structure can detect a random number sequence that contains only one type of repetition of "1" and only one type of repetition of "0", the number of repetitions of "1" being equal to that of repetitions of "0".

For example, the random number test circuit of the fifth embodiment can detect a random number sequence of 1100110011001100 . . . . Of cause, it is also possible to increase the threshold values to determine abnormal, for example, if two types of repetition are contained. In this case, it cannot be determined, unlike the fourth embodiment, which bit data, "1" or 101, constitutes the repetitions. However, in this case, the number of registers required can be reduced.

It is a matter of course that a single shift register can be commonly used for both "1" and "0", instead of commonly using a single register. In this case, the result finally determined from the register values is similar to that acquired by the structure of FIG. 9.

Figure 10:
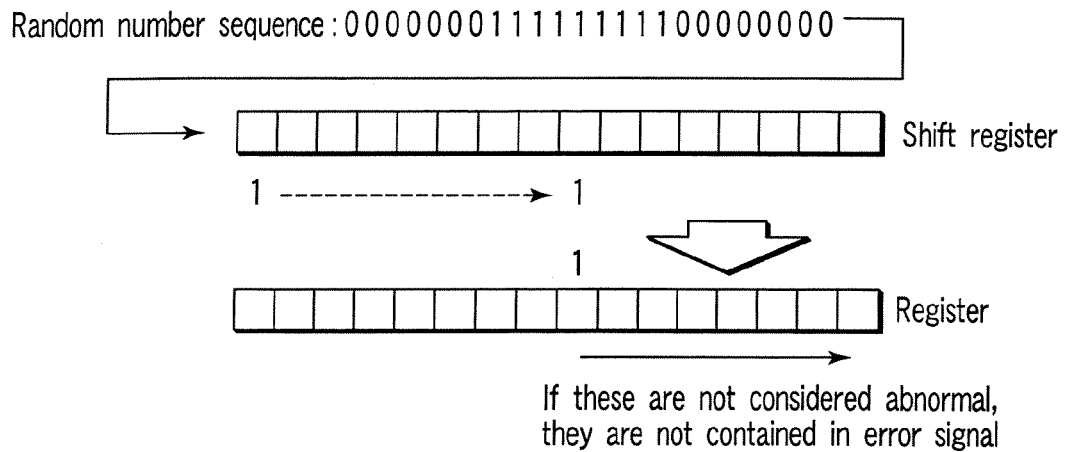
FIG. 10 is a view illustrating the structure of a sixth embodiment of the present invention.

FIG. 10 is a schematic view useful in explaining a random number test circuit according to a sixth embodiment of the invention.

When a used random number sequence is short, it may not always be abnormal even if only one type of repetition of bit data is detected therein. For example, where a 24-bit random number sequence is used, assume that an output of 000000011111111100000000 is acquired. This type of random number sequence may well occur. This sequence can be dealt with the structure shown in FIG. 10.

If one type of repetition occupies the greater part of a random number sequence of a certain bit length as in the case of the random number output example shown in FIG. 10, repetitions finally detected even in a normal random number circuit may be of the one type. In light of this, certain higher-order bits may be ignored when checking the bit values of the register after a random number sequence is output.

Specifically, in the first embodiment, higher-order bits may not be stored in the shift register, and in the second and third embodiments, higher-order bits may not be shifted to the next circuit.

Figure 11:
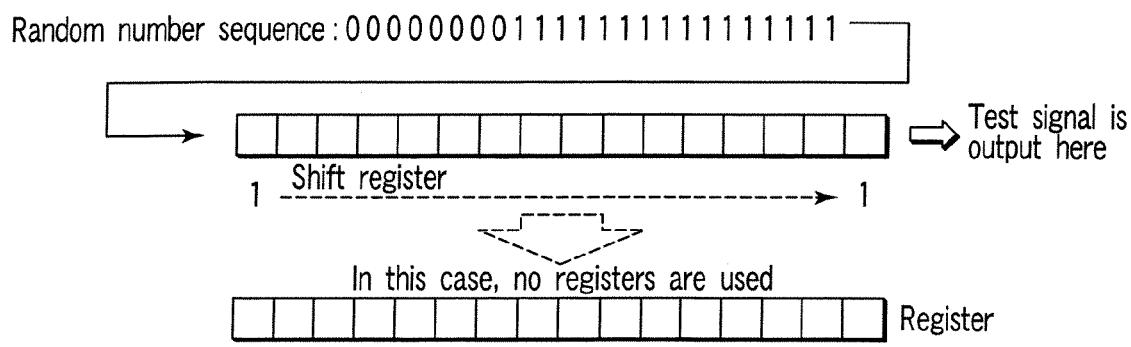
FIG. 11 is a view illustrating the structure of a seventh embodiment of the present invention.

FIG. 11 is a schematic view useful in explaining a random number test circuit according to a seventh embodiment of the invention.

A too-long repetition may raise a problem. Assume, for example, a certain random number sequence acquired has a significantly unbalanced ratio of "1" bits to "0" bits. This type of random number sequence can be tested by the conventional Cu-Sum Test, and by the test circuit of the embodiments shown in FIG. 9.

In the random number test circuit shown in FIG. 11, an allowable maximum number of repetitions can be set depending upon the bit length of the shift register. When the number of repetitions is large, and the highest order bit of the shift register or the bit set as a threshold value is reached, a test signal is output. In this case, no registers (102) are used.

Figure 12:
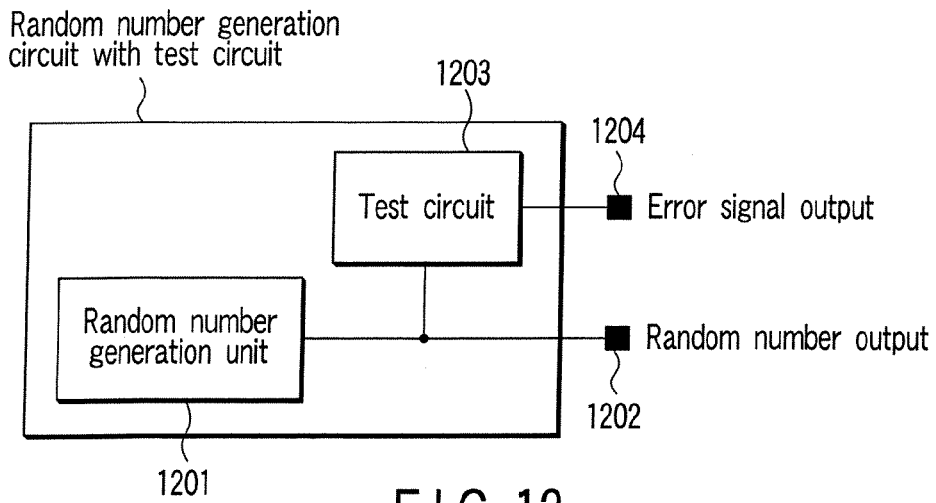
FIG. 12 is a block diagram illustrating a combination, for self-testing a random number sequence, of a test circuit and random number generating unit employed in the embodiments.

FIG. 12 illustrates a random number generation circuit acquired by combining, for self-testing a random number sequence, a test circuit and random number generating unit employed in the embodiments.

A signal indicating a random number sequence and generated by a random number generating unit 1201 is supplied to an output terminal 1202 and the input of a test circuit 1203. If the test circuit 1203 detects an abnormality, it outputs an error signal to an error signal output terminal 1204.

Since thus, the random number test circuit 1203 is contained in the random number generating unit 1201, an error in the random number generating unit can be output as an error signal, and hence the time and effort required for testing can be significantly reduced.

Figure 13:
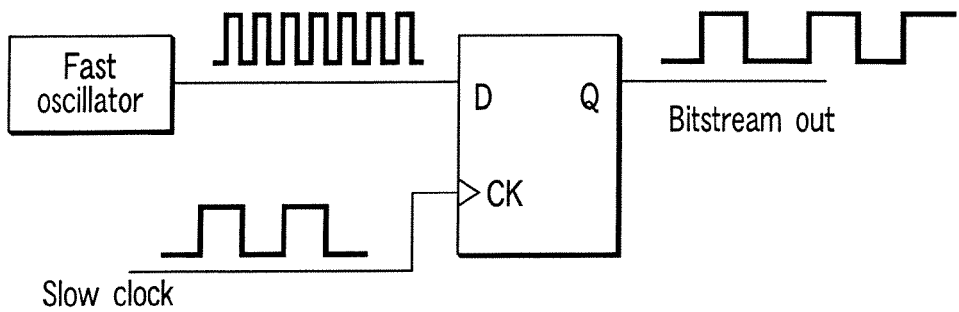
FIG. 13 is a block diagram useful in explaining a random number generating method using clock signals of different frequencies.

FIG. 13 shows an example of the random number generating unit. As shown, this unit employs a method in which clocks of different frequencies, sine waves and/or chopping waves are combined, and a certain noise component is added thereto, thereby generating random outputs (R. C. Fairfield et al., in Proc. CRYPTO '84, pp. 203-230 (1984)). In this random number generating method, when a certain error occurs in the portion to which a noise component is added, it is expected that the output becomes repetitions of "0" and "1" of a certain cycle. This type of error can be easily detected by the test circuit of the embodiment.

The test circuit can detect an abnormality or error that often occurs in digital circuits, such as repetitions of "0" and "1" or repetitions of "0" or "1". Further, since the test circuit is used to test the final random number output, it can be used for all random number generation circuits that acquire digital data from analog data. If an error occurs in conventional random number generation circuits, the test circuit of the embodiment can easily detect the error, although not exactly. The conventional circuits include, for example, a random number generation circuit for subjecting thermal noise to A/D conversion, a random number generation circuit utilizing atomic disintegration, quantum mechanical uncertainty or the periodic fluctuations of fluctuating rectangular waves, and a pseudo-random number generation circuit for generating random numbers based on certain arithmetic.

Figure 14:
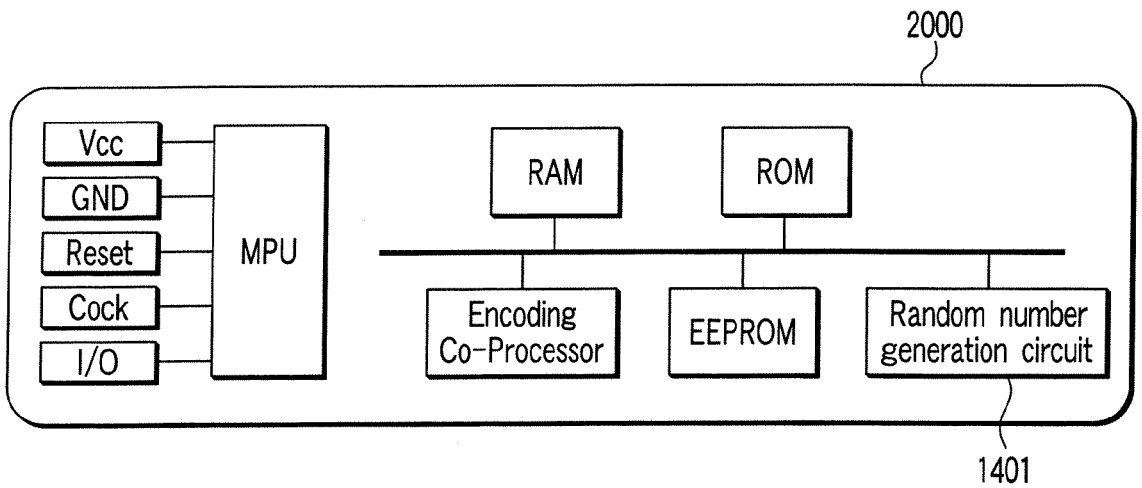
FIG. 14 is a block diagram illustrating an essential part of a semiconductor integrated circuit with a random number generation circuit.

FIG. 14 is a block diagram illustrating an essential part of a semiconductor integrated circuit 2000 provided with a random number generation circuit 1401 according to the embodiments. The semiconductor integrated circuit 2000 is an IC device that can be installed in, for example, IC cards, and comprises an operation unit (MPU), memories (RAM, ROM, EEPROM), auxiliary operation unit (co-processor) and random number generation circuit 1401. The co-processor has a function for executing encryption processing.

The random number generation circuit 1401 includes the random number generation unit and test circuit shown in FIG. 12, and can output an error signal when an error occurs in itself. The random number generation circuit with the test circuit guarantees that random numbers used by the operation unit and co-processor that performs encryption processing are of high quality. Further, random numbers of high quality can be used to disturb changes in the current consumed by an IC, which realizes highly reliable security against cracking in which a cryptographic key is read from the current consumption signal of the IC.

Figure 15:
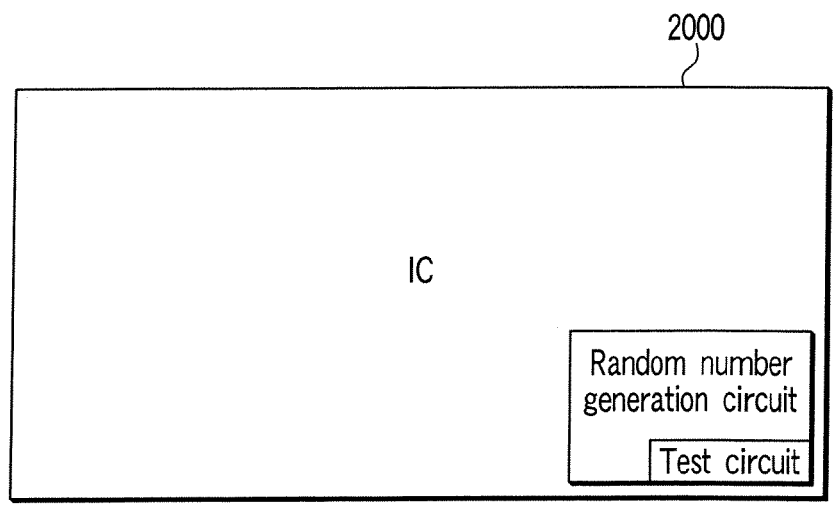
FIG. 15 is a conceptual view useful in explaining the circuit scale of the semiconductor integrated circuit of the embodiments.

FIG. 15 is a conceptual view useful in explaining the circuit scale of the semiconductor integrated circuit 2000 of the embodiments. The random number test circuit 1401 can be formed simply of CMOS logic circuits. Moreover, it is sufficient if the test circuit contains only several hundreds of logical gates, therefore the test circuit can be installed in various ICs. The circuit scale of the test circuit is not more than that shown in FIG. 15, which does not raise the problem that the entire scale of the IC 2000 is significantly increased.

Figure 16:
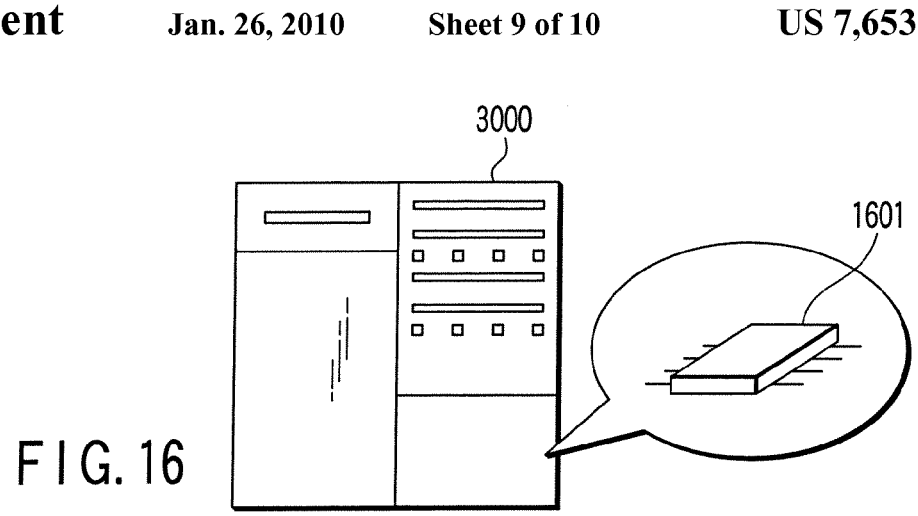
FIG. 16 is a view illustrating a case where the semiconductor integrated circuit of the embodiments is installed in a server for the Internet or radio communication.

For instance, as shown in FIG. 16, a semiconductor integrated circuit 1601 according to the embodiments can be installed in a server 3000 for the Internet or radio communication, and its random numbers can be utilized for, for example, coding. The quality of random numbers generated by the random number generation circuit in the circuit 1601 is guaranteed to be high, which realizes highly reliable security.

Figure 17:
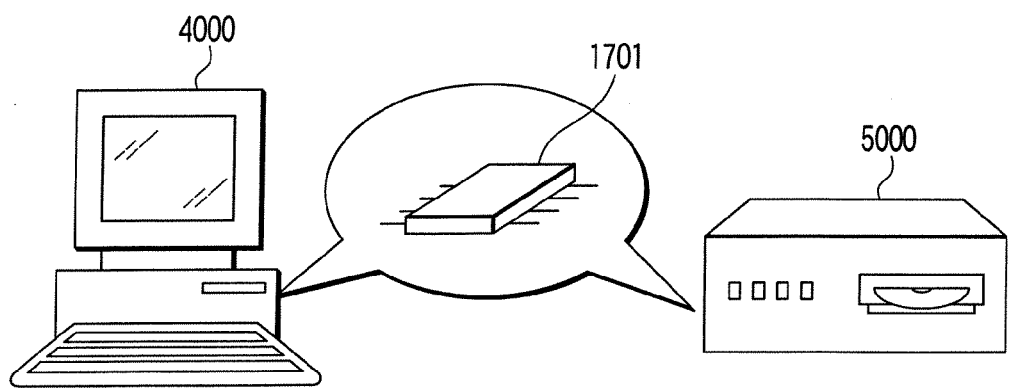
FIG. 17 is a view illustrating a case where the semiconductor integrated circuit of the embodiments is installed in a computer, DVD terminal or game apparatus.

Further, as shown in FIG. 17, a semiconductor integrated circuit 1701 according to the embodiments can be installed in a computer 4000, or a DVD apparatus or game apparatus 5000. This enables random numbers, generated by the random number generation circuit installed, to be used not only for coding, but also for computation and game function, such as Monte Carlo simulation.

Figure 18:
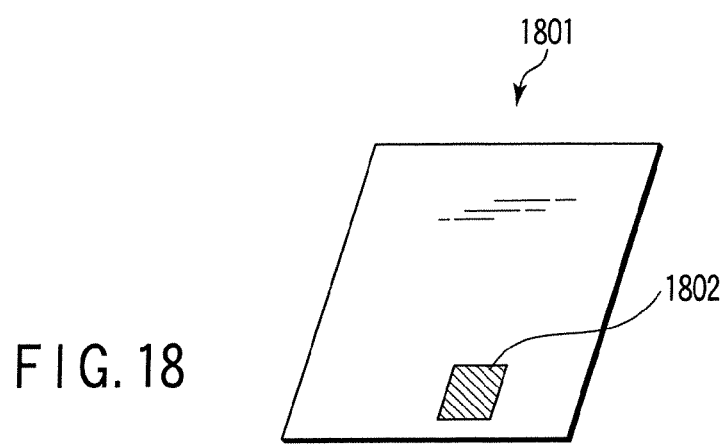
FIG. 18 is a view illustrating an IC card and information terminal according to the embodiments.

FIG. 18 shows an IC card or information terminal device 1801 provided with a semiconductor integrated circuit 1802 according to the embodiments. The IC card includes bank cash cards, prepaid cards and company member's cards, and security cards, etc. Further, the information terminal device includes mobile phones and other portable terminals. These information terminal devices have the functions of, for instance, a word processor, spreadsheet, scheduler, game, E-mail, and/or photography of still or moving images, etc.

Figure 19:
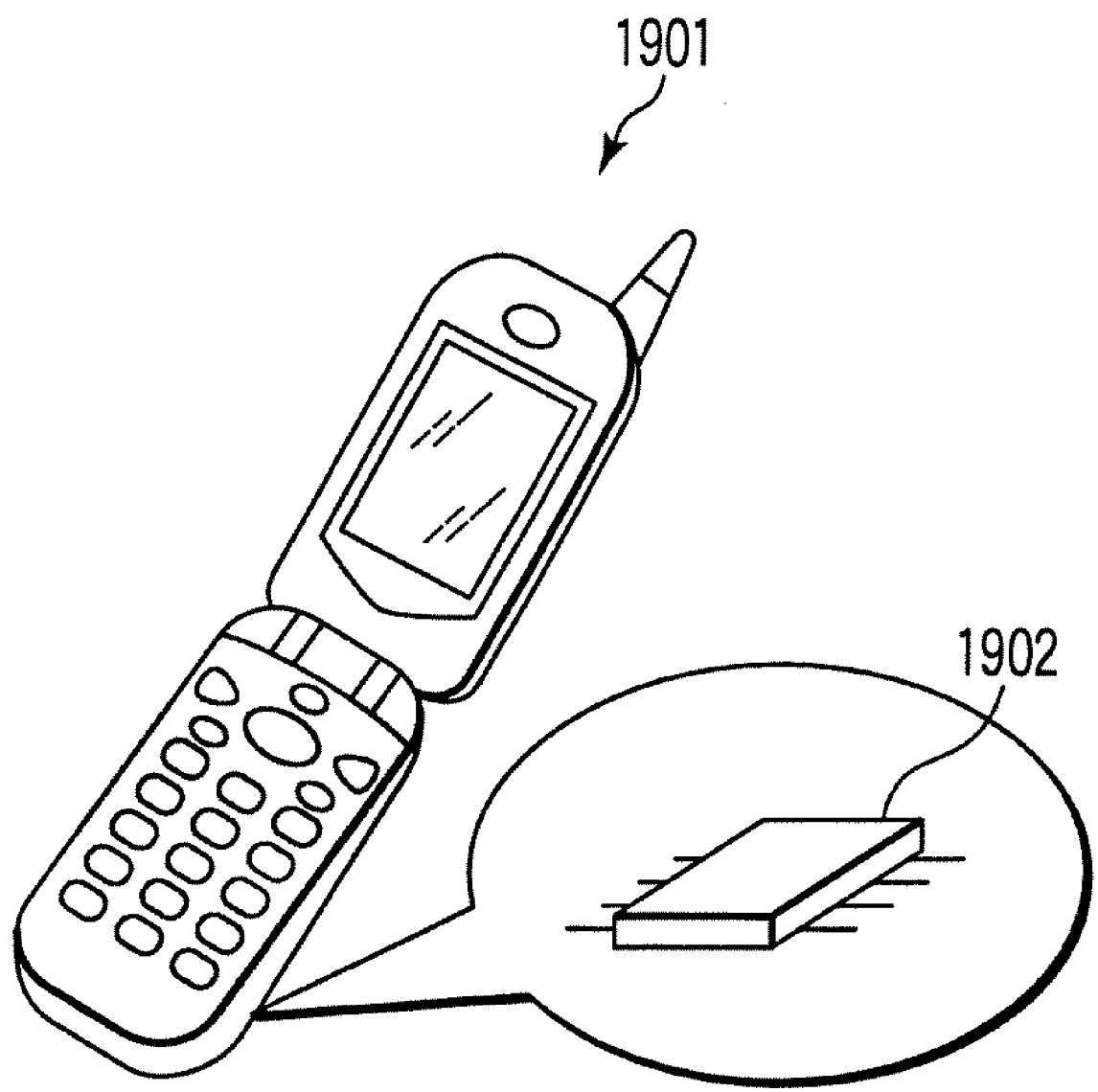
FIG. 19 is a view illustrating a case where the semiconductor integrated circuit of the embodiments is installed in a mobile phone.

The mobile phone 1901 shown in FIG. 19 also can contain a semiconductor integrated circuit 1902 according to the embodiments. The same can be said of a similar portable information terminal.

The present invention is not limited to the above-described embodiments or examples.

For instance, the shift register, register, determination circuit, signal selection circuit, adder, and random number generating circuit, etc., employed in the embodiments, are not limited to the above-described examples. Circuits equivalent to the above in function or operation are included in the scope of the embodiments. Furthermore, in the embodiments, "1" bits are shifted between the stages of the shift register or register to test random number sequences. However, the embodiments can be constructed such that "0" bits are shifted in a similar manner.

The random number generating circuit may be formed of a logic circuit that comprises a plurality of output-uncertain flip-flops arranged parallel or in series.

The flip-flops used in the embodiments are not limited to the D-type ones employed in the examples, but other types of flip-flops can also be used.

In addition, digital random numbers generated by the random number generation circuit of the embodiments may be directly used. However, these random numbers may also be used as data for a random number circuit that utilizes certain arithmetic for generating new random numbers.

The embodiments can provide a test circuit capable of testing the periodicity of random number outputs in a simple way, and a random number generation circuit contained in the test circuit. These circuits can be applied to, for example, IC cards or information terminals, thereby realizing a system of high security and low cost. This provides a significant advantage in the industrial field.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A random number test circuit, comprising:
a counting unit configured to count a number of repetitions of "0" or "1" in a random number sequence, the repetitions occurring in series, each random number in the random number sequence being one of "0" and "1";
a detecting unit configured to detect at least one type of repetition in the random number sequence by the counted number, each type being a number of the repetitions of a same "0" or "1" in series; and
a determining unit configured to determine that the random number sequence is normal if a number of the types detected by the detecting unit is more than a first threshold value.

2. A random number generation circuit comprising:
a generation unit configured to generate the random number sequence; and
the random number test circuit according to claim 1, which tests the random number sequence.

3. The random number test circuit according to claim 1, further comprising:
a storage unit configured to store a position corresponding to the counted number to obtain a plurality of positions; and
a determination circuit configured to determine the type from the positions.

4. The random number test circuit according to claim 1, wherein the first threshold value is one if a length of the random number sequence is not more than a second threshold value, and the first threshold value is two if the length is more than the second threshold value.

5. A random number test circuit, comprising:
a receiving unit configured to receive a random number sequence;
a detection circuit configured to detect a plurality of bit data items of "1" or "0" in the random number sequence;
a shift register which holds in series the bit data items of "1" or "0" repeated in the random number sequence, based on the detected bit data items;
a register which holds, based on the detected bit data items, a bit position in the shift register when each of the bit data items is switched from "1" to "0" or from "0" to "1"; and
a determination circuit configured to determine types of repetitions of the bit data items of "1" or "0" from the bit position, each of the types being a number of the repetitions of a same "0" or "1" in series.

6. The random number test circuit according to claim 5, wherein the determination circuit includes a signal selection circuit which receives a signal indicating the bit position.

7. The random number test circuit according to claim 5, wherein the determination circuit includes an adder circuit which sums a plurality of values in the bit position.

8. The random number test circuit according to claim 5, wherein the determination circuit includes a counter circuit which counts a plurality of values in the bit position.

9. A random number generation circuit comprising:
a generation unit configured to generate the random number sequence; and
the random number test circuit according to claim 5, which tests the random number sequence.

10. A random number test circuit, comprising:
a receiving unit configured to receive a random number sequence;
a detection circuit configured to detect a plurality of bit data items of "1" and "0" in the random number sequence;
a plurality of shift registers which hold in series the bit data items of "1" and "0" repeated in the random number sequence, based on the detected bit data items;
a register which holds, based on the detected bit data items, a plurality of bit positions in the shift registers when the bit data items are switched from "1" and "0" to "0" and "1", respectively; and
a determination circuit configured to determine types of repetitions of the bit data items "1" and "0" from the bit positions, each of the types being a number of the repetitions of a same "0" or "1" in series.

11. The random number test circuit according to claim 10, wherein the determination circuit includes a signal selection circuit which receives a plurality of signals indicating the bit positions.

12. The random number test circuit according to claim 10, wherein the determination circuit includes an adder circuit which sums a plurality of values in each of the bit positions.

13. The random number test circuit according to claim 10, wherein the determination circuit includes a counter circuit which counts a plurality of values in each of the bit positions.

14. A random number generation circuit comprising:
   a generation unit configured to generate the random number sequence; and
   the random number test circuit according to claim 10, which tests the random number sequence.

15. A semiconductor integrated circuit device, comprising:
   a generation unit configured to generate a random number sequence;
   a random number test circuit which tests the random number sequence supplied from the generation unit, and generates a test signal; and
   an output terminal which outputs the test signal,
   wherein the random number test circuit includes
      a receiving unit configured to receive the random number sequence;
      a detection circuit configured to detect a plurality of bit data items of "1" and "0" in the random number sequence;
      a plurality of shift registers which hold in series the bit data items of "1" and "0" repeated in the random number sequence, based on the detected bit data items;
      a register which holds, based on the detected bit data items, a plurality of bit positions in the shift registers when the bit data items are switched from "1" and "0" to "0" and "1", respectively; and
      a determination circuit configured to determine types of repetitions of the bit data items "1" and "0" from the bit positions, each of the types being a number of the repetitions of a same "0" or "1" in series.

16. An integrated circuit card provided with a semiconductor integrated circuit, the semiconductor integrated circuit comprising:
   a generation unit configured to generate a random number sequence;
   a random number test circuit which tests the random number sequence supplied from the generation unit, and generates a test signal; and
   an output terminal which outputs the test signal,
   wherein the random number test circuit includes a receiving unit configured to receive the random number sequence;
      a detection circuit configured to detect a plurality of bit data items of "1" and "0" in the random number sequence;
      a plurality of shift registers which hold in series the bit data items of "1" and "0" repeated in the random number sequence, based on the detected bit data items;
      a register which holds, based on the detected bit data items, a plurality of bit positions in the shift registers when the bit data items are switched from "1" and "0" to "0" and "1", respectively; and
      a determination circuit configured to determine types of repetitions of the bit data items "1" and "0" from the bit positions, each of the types being a number of the repetitions of a same "0" or "1" in series.

17. An information terminal device provided with a semiconductor integrated circuit, the semiconductor integrated circuit comprising:
   a generation unit configured to generate a random number sequence;
   a random number test circuit which tests the random number sequence supplied from the generation unit, and generates a test signal; and
   an output terminal which outputs the test signal,
   wherein the random number test circuit includes
      a receiving unit configured to receive the random number sequence;
      a detection circuit configured to detect a plurality of bit data items of "1" and "0" in the random number sequence;
      a plurality of shift registers which hold in series the bit data items of "1" and "0" repeated in the random number sequence, based on the detected bit data items;
      a register which holds, based on the detected bit data items, a plurality of bit positions in the shift registers when the bit data items are switched from "1" and "0" to "0" and "1", respectively; and
      a determination circuit configured to determine types of repetitions of the bit data items "1" and "0" from the bit positions, each of the types being a number of the repetitions of a same "0" or "1" in series.

* * * * *